United States Patent [19]

Lindahl

[11] Patent Number: 4,984,990

[45] Date of Patent: Jan. 15, 1991

[54] CONNECTION PLUG FOR A MICROWAVE UNIT

[75] Inventor: Per A. A. Lindahl, Huddinge, Sweden

[73] Assignee: Telefonaktiebolaget L M Ericsson, Stockholm, Sweden

[21] Appl. No.: 365,435

[22] Filed: Jun. 13, 1989

[30] Foreign Application Priority Data

Jun. 16, 1988 [SE] Sweden ................................ 8802263

[51] Int. Cl.[5] ................................................ H05K 1/00

[52] U.S. Cl. ....................................... 439/63; 439/581; 439/876

[58] Field of Search ................................ 439/578–585, 439/63, 78, 83; 333/33, 238, 245, 246, 260

[56] References Cited

U.S. PATENT DOCUMENTS

| | | | |
|---|---|---|---|
| 3,686,624 | 8/1972 | Napoli et al. | 439/581 |
| 4,186,358 | 1/1980 | Czech et al. | 333/33 |
| 4,611,186 | 9/1986 | Ziegner | 333/33 |
| 4,656,441 | 4/1987 | Takahashi et al. | 439/63 |
| 4,669,805 | 6/1987 | Kosugi et al. | 439/581 |
| 4,715,821 | 12/1987 | Axell | 439/63 |
| 4,721,481 | 1/1988 | Grellmann et al. | 439/581 |
| 4,724,409 | 2/1988 | Lehman | 439/581 |

FOREIGN PATENT DOCUMENTS

| | | | |
|---|---|---|---|
| 0039101 | 3/1984 | Japan | 439/63 |

*Primary Examiner*—David L. Pirlot

*Attorney, Agent, or Firm*—Burns, Doane, Swecker & Mathis

[57] ABSTRACT

A connection plug which is to be fitted to a casing (M) carrying a substrate plate (B, S), on which microwave components are mounted and mutually connected with the aid of striplines. Certain striplines have their end portions taken out to the edges of the substrate plate. The plug contains a coaxial conductor junction, known per se, between an incoming coaxial conductor (K) and an outgoing conductor (*6b*) towards the substrate plate. In accordance with the invention, the plug has a projecting part (3) carrying a substrate piece (8) with a stripline (12) which, when the plug is fitted, is in line with the end portion of a stripline (11) on the substrate plate (S). The coaxial junction can thus be tested before fitting, and the connection between stripline (11) of the substrate plate and the stripline of the substrate piece (8) can be readily carried out during fitting.

3 Claims, 1 Drawing Sheet

CONNECTION PLUG FOR A MICROWAVE UNIT

TECHNICAL FIELD

The present invention relates to a connection plug intended for fitting into a microwave unit for electrically connecting a flat conductor (stripline) on the microwave unit substrate wafer to an outside coaxial conductor.

BACKGROUND OF THE INVENTION

Microwave units, i.e. on which microwave components are built up and which are intended for the frequency range 10–50 GHz, require special connection means for the connections from one unit to remaining units. Usually, coaxial conductors are used for electrical connection between the different units. Several microwave components may be mounted on a common substrate, and the connections between the different components on the substrate can then be rapidly provided, e.g. in the form of striplines. The problem which then occurs is obtaining a reliable junction between the coaxial conductors and the conductors of the substrate of the respective microwave unit.

With incoming coaxial conductors it is already known to use connectors which are attached to the substrate wafer of the microwave unit along its short side. Special connector implementations have been developed for this purpose which give reliable connection to the substrate wafer. One type of such connector is sold under the name of "K-Connector" by Wiltron with the designation "Part Number K100". Such a connector comprises a coaxial junction mounted in a plug which can be screwed to the microwave unit. Incoming coaxial conductors are connected to a first unit comprising a central conductor with two pins, which one is the female connection for the coaxial conductor and the other is in contact with a glass bead which is soldered to the stripline of the substrate. The glass bead then constitutes the coaxial junction between the outside conductor and the substrate, and is furthermore soldered to the microwave unit itself so that stable and good contact is obtained to the substrate conductor.

OBJECT OF THE INVENTION

In the above-mentioned mounting of an outside coaxial conductor to a substrate, a substrate stripline is soldered to a coaxial junction with dielectric material (the glass bead) in mechanical unit. In addition, the glass bead is soldered to the unit for obtaining a stable soldering point between the substrate stripline and the glass bead. This requires a special soldering technique, and it is very important that soldering is completely satisfactory to obtain good microwave contact at frequencies up to 40 GHz. A microwave unit generally has several coaxial inputs, e.g. five such inputs, to the substrate. It is practically impossible to make test measurement of the contacts for the different connections before the inner components of the unit have been put in place, and therefore a reliable test measurement of the contacts is never obtained before assembly.

For example, if the unit has five contact sites and one of these has poor contact the unit is spoiled and cannot be used. It is not possible to change a connector and substrate which has been soldered on once, if soldering has been poorly executed. The entire unit must be rejected. The entire unit is only fully serviceable if all the contact sites are completely satisfactory, which is not known with certainty after soldering, since, as explained above, test measurements on the individual contact sites cannot be carried out.

The present invention intends to solve the above-mentioned problem in soldering coaxial connections to the different contact sites. With the aid of the connection plug in accordance with the invention the sensitive and special soldering of the coaxial junction (the glass bead) is carried out before the complete plug is connected to the substrate stripline. This means that test measurements of the contact site made by the plug can be carried out before it is connected to the substrate stripline, and thereafter approve or reject the plug before its use as a microwave connection. A plug thus approved can be subsequently readily mounted and connected to the substrate stripline without any subsequent test measurement being needed. The connection plug in accordance with the invention is characterized as disclosed by the characterizing portion of claim 1.

BRIEF DESCRIPTION OF DRAWING

The invention will now be described in more detail, and with reference to the accompanying drawing, where.

BEST MODES FOR CARRYING OUT THE INVENTION

Figure 1:
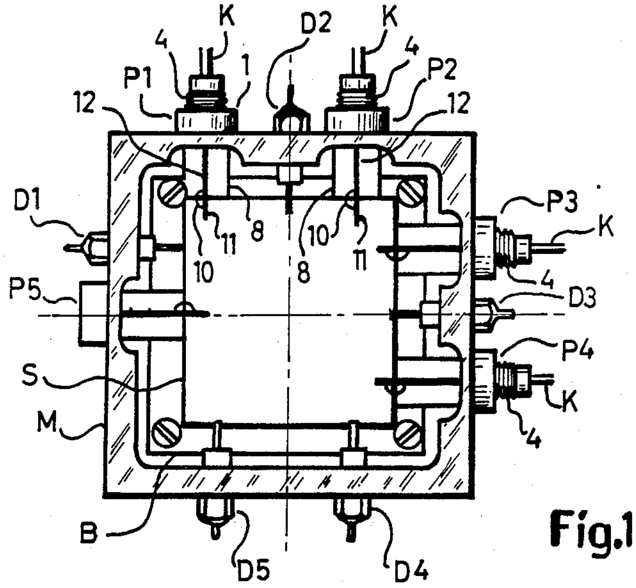
FIG. 1 illustrates a microwave unit seen from above and fitted with a plurality of plugs in accordance with the invention.

In FIG. 1 there is illustrated in a view from above the mechanical construction of a microwave unit with a casing M, in which a support plate B is mounted. The support plate B is screwed to the casing M in a suitable way and carries a substrate S on which the different microwave components are mounted. Conductors in the form of striplines are provided on the substrate S to the different components. These are not shown in detail, since they are no part of the invention, with the exception of certain end portions 11 which are described in more detail below.

Five connection plugs P1–P5 are mounted on the casing M for enabling the connection of outside coaxial conductors K to the stripline 11 of the substrate. The plugs P1–P5 may be inserted into, and clamped in holes along the short sides of the casing M. In addition, a plurality of DC leads-through D1–D5 are screwed to the casing M.

In accordance with the invention, each plug is provided with a piece or bit of substrate 8 of the same material as the substrate 5 and with a conductor 12 which is in line with a substrate stripline 11 in the assembled state of the plug.

Figure 2A:
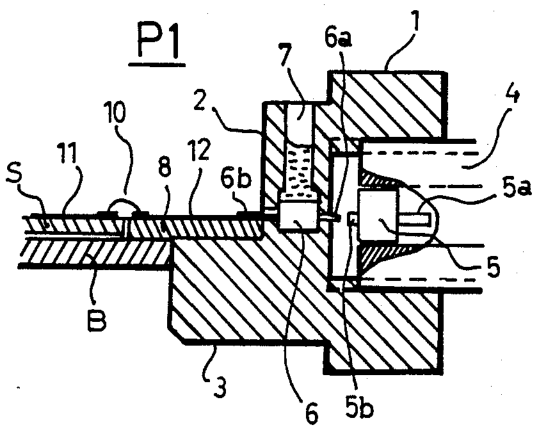
FIGS. 2*a*–2*c* illustrate the inventive plug in side view, front view and a view from above.

FIG. 2*a* shows in more detail from one side a cross section of a plug in accordance with the invention. It essentially comprises three parts: a cylindrical hollow body part 1, a cylindrical flange part 2 and a part 3 projecting out from the body part 1. The body part 1 has a cylindrical, internally threaded cavity for meshing with a threaded sleeve 4.

The sleeve 4 constitutes the ground conductor for the incoming coaxial conductor K and inside the sleeve 4 there is a cylindric, electrically conductive body 5 engaging against the inner wall of the sleeve 4, and is thus in contact with the ground conductor. Inside this body there is a dielectric, concentric layer. A central conductor towards the incoming coaxial conductor K consists of a hollow pin 5*a*, which can be connected mechanically to the central conductor of the incoming coaxial conductor.

Inside the flange part 2 there is a cylindrical space for a, conductor element, glass bead 6, which together with the body 5 forms a coaxial air-glass junction between the incoming coaxial conductor and the substrate. The glass bead 6 has a central conductor towards the body 5 in the form of a pin 6*a*, and when the plug is fitted, this pin projects into the central conductor 5*b* of the body 5. The central conductor of the glass bead towards the substrate comprises the same pin 6*b*, which projects out a distance through an opening in the flange part 2 towards a substrate piece 8. The glass bead 6 is fixed in its position inside the part 2 by soldering, which is carried out via a capillary hole 7 on the upper side of the flange part. The cylindrical body 5 constitutes an adapter for the central conductor of the incoming coaxial conductor and central conductor 6*a*, 6*b* of the glass bead 6, and forms together with it a coaxial conductor air-glass (or other dielectric junction from the incoming coaxial conductor to the substrate conductor. The ground contact is obtained by the side surfaces of the body 5 engaging tightly against the glass bead sheath in the fitted state.

The above-described coaxial conductor junction-/adaption device is described in detail in the specification from WILTRON mentioned in the introduction.

Figure 2C:
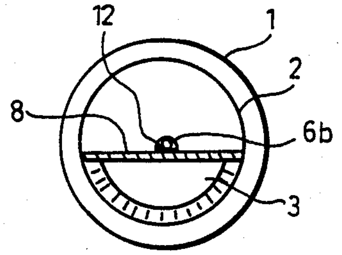
Figure 2B:
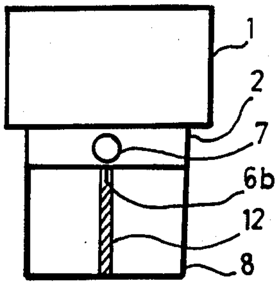

The half-cylindrical part 3 projecting out from the body part 1 and from the flange part 2 has a flat upper side which forms a longitudinal planar surface. The substrate piece 8 (starting substrate) is glued on to this flat surface. A flat conductor 12 (FIG. 2*b*) is arranged on the substrate piece 8, and has a position such that when the plug is fitted to the casing M, the conductor 12 is directly opposite a conductor 11 on the substrate plate S (FIG. 1). As seen in FIGS. 2*a* and 2*c*, the half cylindrical part 3 has a flat front side which forms a transverse planar surface which abuts the base plate B and thereby helps to hold the plug in a fixed position relative to the base plate B. FIG. 2*a* further illustrates how a bond 10 is made between the conductor 12 on the substrate piece 8 and the conductor 11 on the substrate 8. This bond can be readily carried out after the plug has been fitted, e.g. with the aid of supersonics, heat and pressure, so that the bond wire (AU) melts into the striplines 11, 12. FIG. 12*c* illustrates the plugs seen from the left in FIG. 2*a*.

The inventive plug thus comprise a unit corresponding to a known plug with the coaxial junction 5 and 6 and a starting substrate piece 8 attached to the part 3. The delicate soldering of the glass bead inside the plug and to the starting substrate 8 has already been done. Before fitting, a plurality of manufactured plugs is tested with regard to their microwave properties, e.g. for 40 GHz and 18 GHz:

(a) Plugs which can be used for 40 GHz, and thereby for 18 GHz:

(b) Plugs which can only be used for 18 GHz, (c) Plugs which cannot be used for 18 GHz or 40 GHz. These plugs are rejected.

After testing the properties of a plurlity of manufactured plugs have thus been determined, and those that meet given requirements (40 GHz) can be fitted into a microwave unit, and may also be replaced. The unit will never be spoiled due to the connector mounting.

In the claims:

1. A coaxial conductor-to-stripline conductor connection plug for connecting a microwave unit stripline conductor on a substrate plate of a microwave unit to a coaxial conductor, comprising:

a hollow body part including a central cavity for receiving a coaxial conductor;

a flange part integral with said hollow body part;

a conductor element enclosed within said flange part, said conductor element including a central conductor which projects out from either side of said flange part, a first end of said central conductor for connection with the coaxial conductor;

a projecting part integral with and projecting from said flange part, said projecting part being formed as a half cylinder, a longitudinal planar surface of said half cylinder forming a flat surface and a transverse planar surface of said half cylinder for abutting a base plate of the microwave unit and thereby helping to hold said connection plug in a fixed position relative to the base plate;

a substrate piece mounted on said flat surface; and a plug stripline conductor mounted on said substrate piece for connection with the microwave unit stripline conductor, a second end of said central conductor being in contact with and electrically connected to said plug stripline conductor.

2. A coaxial conductor-to-stripline conductor connection plug as claimed in claim 1, wherein said central cavity is internally threaded.

3. A coaxial conductor-to-stripline conductor connection plug as claimed in claim 1, wherein said conductor element includes a glass bead.

* * * * *